United States Patent
Boyer et al.

(10) Patent No.: US 7,055,081 B2
(45) Date of Patent: May 30, 2006

(54) SYSTEM AND METHOD FOR MULTI-CHANNEL DECODING ERROR CORRECTION

(75) Inventors: Keith Gary Boyer, Thornton, CO (US); Kevin M. Horn, Boulder, CO (US)

(73) Assignee: Storage Technology Corporation, Louisville, CO (US)

( * ) Notice: Subject to any disclaimer, the term of this patent is extended or adjusted under 35 U.S.C. 154(b) by 740 days.

(21) Appl. No.: 09/798,357

(22) Filed: Mar. 2, 2001

(65) Prior Publication Data
US 2002/0129316 A1    Sep. 12, 2002

(51) Int. Cl.
*G01C 29/00* (2006.01)
(52) U.S. Cl. .................. 714/764; 714/769
(58) Field of Classification Search ........... 714/764, 714/769, 761, 787, 788; 360/55
See application file for complete search history.

(56) References Cited

U.S. PATENT DOCUMENTS

| 5,465,180 A | 11/1995 | Amada et al. |
| 5,841,794 A | 11/1998 | Inoue et al. |

FOREIGN PATENT DOCUMENTS

| DE | 4120317 | * | 1/1992 |
| EP | 0 310 110 |   | 4/1989 |
| EP | 310 110 | * | 4/1989 |
| EP | 0 530 037 |   | 3/1993 |
| EP | 0 718 842 |   | 6/1996 |
| EP | 08 265304 |   | 10/1996 |

OTHER PUBLICATIONS

Anonymous: "Multiple Channel Correction of Burst Errors. Aug. 1964." IBM Technical Disclosure Bulletin, vol. 7, No. 3, Aug. 1, 1964, pp. 190-191, XP002197198, New York, US.
"Error Recovery Channel", IBM Technical Disclosure Bulletin, IBM Corp., New York, US, vol. 40, No. 2, Feb. 1, 1997, pp. 219-220, XP000692227.
English Translation of Unexamined German Patent Application No. DE 41 20 317 A1, dated Jun. 20, 1991; Applicant: Samsung Electronics Co., Ltd.; Inventor: Kim, Kye-jong, Suwon, KR; 24 pages.

* cited by examiner

*Primary Examiner*—Guy J. Lamarre
(74) *Attorney, Agent, or Firm*—Brooks Kushman P.C.

(57) ABSTRACT

In a magnetic recording device, a system and method for correcting errors in decoding a read data input signal. The system and method include multiple decoding channels, each channel processing the read data input signal and generating an output signal, where the output signal includes a data signal when no error is detected, and an error detection code when an error is detected. The system and method also include multiple error correction code (ECC) decoders, each decoder associated with and receiving the output signal of one of the channels and generating a corrected data signal when the received output signal is an error detection code and the error is correctable. The system and method further include a controller for selecting from the decoders one of the corrected data signals.

21 Claims, 2 Drawing Sheets

SYSTEM AND METHOD FOR MULTI-CHANNEL DECODING ERROR CORRECTION

TECHNICAL FIELD

The present invention relates generally to a system and method, in a magnetic recording device, for error correction in multi-channel decoding of read data and, more particularly, to a system and method for error correction in multi-channel decoding of read data using a plurality of inner error correction code decoders.

BACKGROUND ART

In a magnetic recording device, such as a magnetic tape or disk, the process of recovering data includes decoding read data stored on the recording device. In that process, N multiple decoding channels may be provided, each channel operating on the same analog or digital read data. Each of these channels can be designed to perform optimally under various signal characteristics.

In each channel, if no error is detected during decoding, the channel presents a properly decoded data output. Alternatively, however, if an error is detected during decoding, the channel presents a decode Error Detection Code (EDC) error output. In such magnetic recording devices, one of the outputs from the multiple channels is then selected for transmission and further use. In that regard, if any one or more channels present properly decoded data outputs, one such output is the output selected.

As is known in the art, in such magnetic recording devices, an inner Error Correction Code (ECC) decoder may be provided. Such an inner ECC decoder may be used to attempt to correct the output of a channel presenting a decode EDC error. However, when an inner ECC decoder is introduced in such a magnetic recording device, a problem arises in selecting which channel output to correct if all channels are in error, i.e., if all channels present decode EDC errors.

The present approach to such a situation is to essentially guess which channel output to select to be sent to the inner ECC decoder for processing. For example, the output selected may be the output from the statistically most reliable channel, or simply the output that represents the least significant type of decode EDC error. Regardless, whichever channel output is selected is then sent to the inner ECC decoder in an attempt to correct the error.

Such an approach, however, may not be the best answer, as it presents an additional problem. Namely, it is possible that even after operation of the inner ECC decoder on the channel output selected, the decode EDC error is uncorrectable. In that case, one or more other channel outputs that were not selected may have been correctable by the inner ECC decoder. While the magnetic recording device might be configured to then select an output from the remaining channels for processing by the inner ECC decoder, continuing until a selected output is successfully corrected or all channel outputs have been exhausted, such sequential or serial selection would increase processing time, causing delay.

Thus, there is needed, in a magnetic recording device, an improved system and method for error correction in multi-channel decoding of read data. Such a system and method would provide an inner ECC decoder for each of the N multiple channels. Rather than, as in the prior art, guessing which channel output should be sent to the inner ECC decoder, in such an improved system and method, every channel output would be passed through an inner ECC decoder prior to the selection process. By using multiple dedicated inner ECC decoders, such a system and method would guarantee that no correctable channel output will be overlooked, without causing delay by increasing processing time. If multiple channels decode properly (either no decode EDC errors are presented, or any such errors are corrected by an inner ECC decoder), data from one such successful channel is selected and sent on. Similarly, if all of the channels present decode EDC errors and are all still in error even after inner ECC decoder operation (all channel outputs were uncorrectable), data from one channel is selected and sent on. The combination of separate channel characteristics and separate inner ECC decoders for each channel provides the greatest chance for successful decoding in a multi-channel architecture.

SUMMARY OF THE INVENTION

Accordingly, it is an object of the present invention to provide an improved system and method for correcting errors in decoding a read data input signal in a magnetic recording device. The magnetic recording device may be a magnetic tape, disk, or other medium, and the read data input signal may be digital or analog.

According to the present invention, a system is provided, in a magnetic recording device, for correcting errors in decoding a read data input signal. The system comprises a plurality of decoding channels, each channel processing the read data input signal and generating an output signal, the output signal comprising a data signal when no error is detected, and an error detection code when an error is detected. The system also comprises a plurality of error correction code (ECC) decoders, each ECC decoder associated with and receiving the output signal of one of the plurality of channels and generating a corrected data signal when the received output signal comprises an error detection code and the error is correctable. The system further comprises a controller for selecting from the plurality of ECC decoders one of the corrected data signals.

Still further according to the present invention, a method is also provided, in a magnetic recording device, for correcting errors in decoding a read data input signal. The method comprises processing the read data input signal in a plurality of decoding channels, and generating an output signal from each channel, the output signal comprising a data signal when no error is detected, and an error detection code when an error is detected. The method also comprises receiving the output signals in a plurality of error correction code (ECC) decoders, each ECC decoder associated with and receiving the output signal of one of the plurality of channels, and generating from each ECC decoder a corrected data signal when the received output signal comprises an error detection code and the error is correctable. The method further comprises selecting one of the corrected data signals from the plurality of ECC decoders.

According to the present invention, a method is also provided, in a magnetic recording device, for correcting errors in decoding a read data input signal comprising providing a plurality of decoding channels, each channel processing the read data input signal and generating an output signal, the output signal comprising a data signal when no error is detected, and an error detection code when an error is detected. The method also comprises providing a plurality of error correction code (ECC) decoders, each ECC decoder associated with and receiving the output signal of one of the plurality of channels and generating a corrected data signal when the received output signal comprises an error detection code and the error is correctable. The method further comprises providing a controller for selecting from the plurality of ECC decoders one of the corrected data signals.

The above objects and other objects, features, and advantages of the present invention are readily apparent from the following detailed description of the best mode for carrying out the present invention when taken in connection with the accompanying drawings.

BEST MODES FOR CARRYING OUT THE INVENTION

Figure 1:
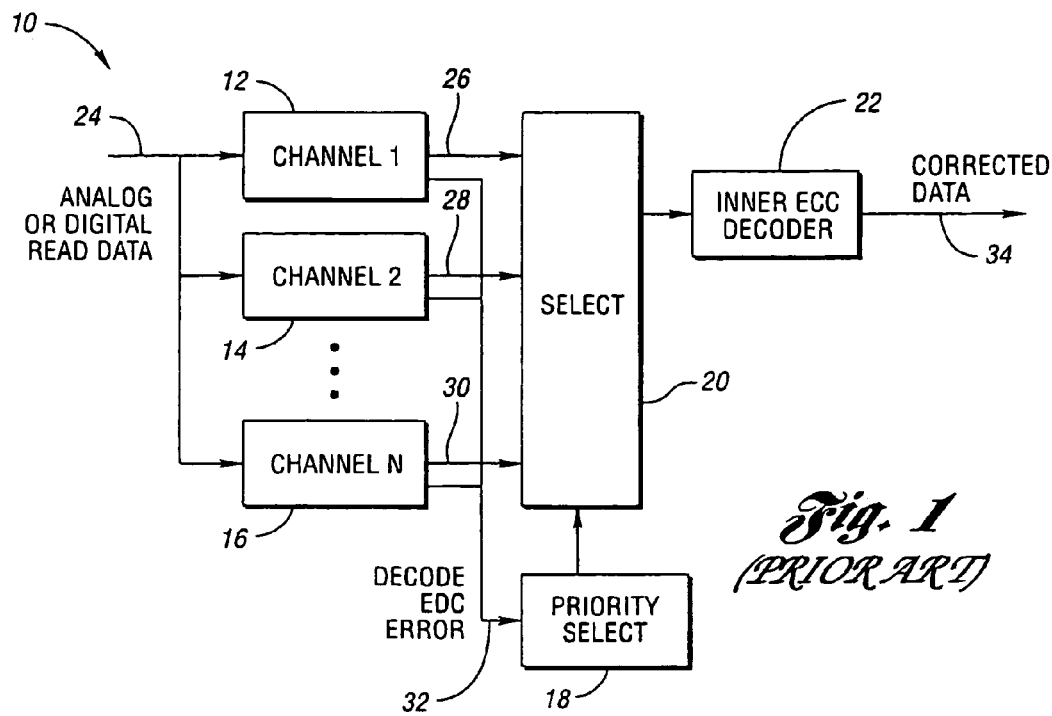
FIG. 1 illustrates a block diagram of a multi-channel inner ECC architecture according to the prior art.
Figure 2:
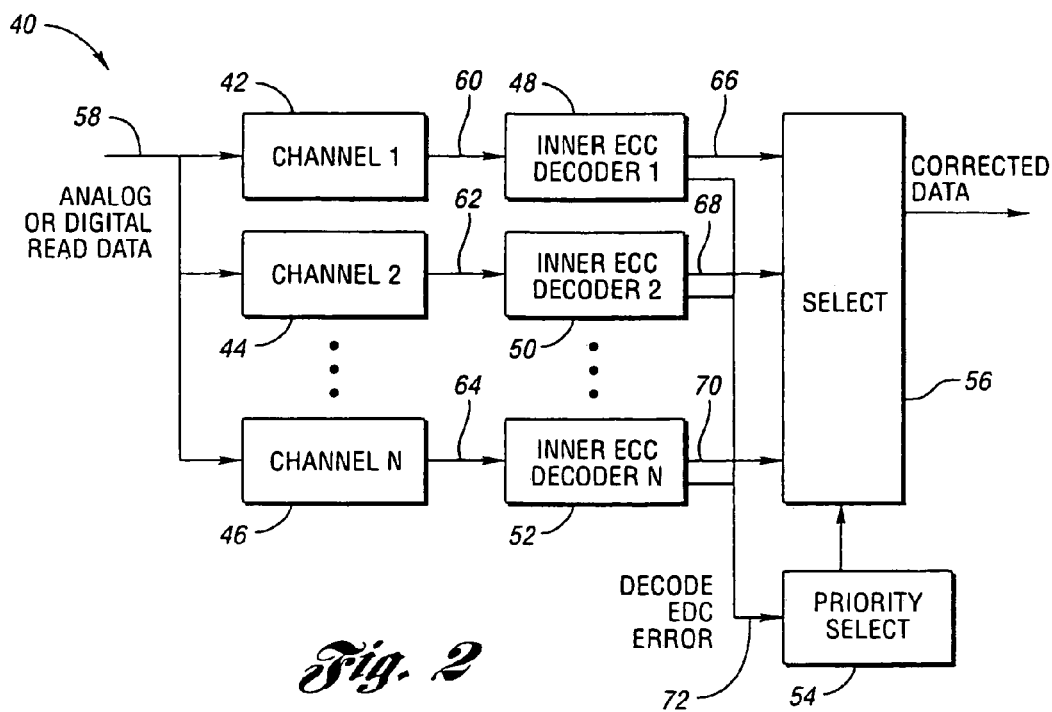
FIG. 2 illustrates a block diagram of the multi-channel inner ECC architecture according to the present invention.
Figure 3:
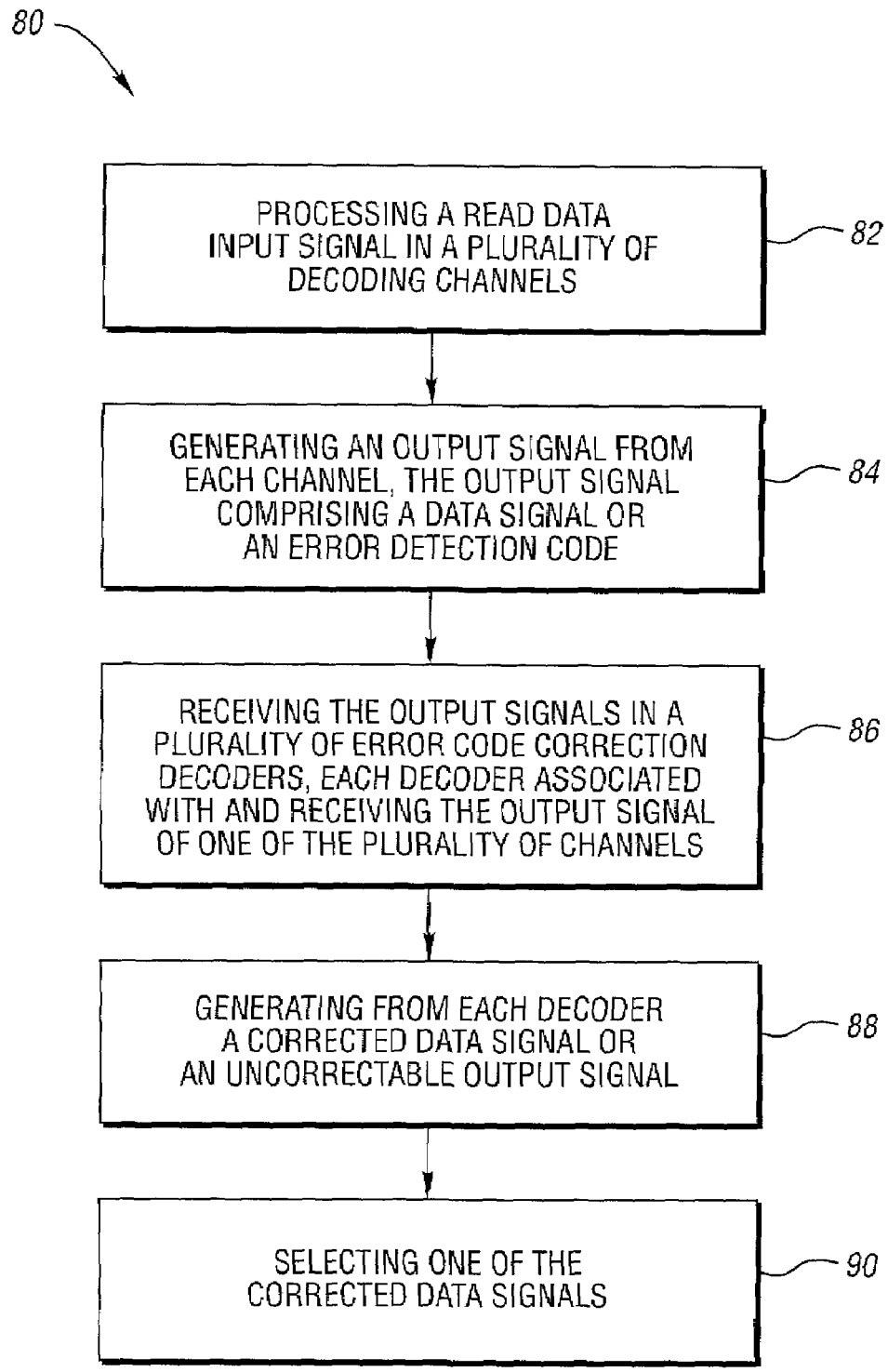
FIG. 3 illustrates a simplified, representative flow chart of the method for multi-channel inner ECC according to the present invention.

With reference to FIGS. 1–3, the preferred embodiment of the method and system of the present invention will now be described in greater detail. Referring first to FIG. 1, a block diagram of a multi-channel inner ECC architecture according to the prior art is shown, denoted generally by reference numeral 10.

As seen therein, and as previously noted, in a magnetic recording device, such as a magnetic tape or disk, the process of recovering data stored on the recording device may employ N multiple decoding channels (12, 14, 16), a controller (18), a selector (20) (such as a switching or gating device known in the art), and an inner ECC decoder (22). As shown in FIG. 1, each of the multiple channels (12, 14, 16) are provided in communication with controller (18), which is provided in communication with selector (20). Selector (20) is further provided in communication with each of the multiple channels (12, 14, 16), as well as with ECC decoder (22).

Each of the multiple channels (12, 14, 16) receive a read data input signal (24), which may be either an analog or digital signal. Thus, as is readily apparent, each of the multiple channels (12, 14, 16) operate on the same analog or digital read data input signal (24). As noted above, each of the multiple channels (12, 14, 16) can be designed in any of a number of fashions known in the art to perform optimally under various signal characteristics.

As also noted above, each of the multiple channels (12, 14,16) provides an output signal (26, 28, 30). In each channel, if no error is detected during decoding, the output signal (26, 28, 30) presented by the channel comprises a properly decoded data output. Alternatively, however, if an error is detected during decoding, the output signal (26, 28, 30) presented by the channel comprises a decode Error Detection Code (EDC) error output, of the types well known to those of ordinary skill in the art.

Still referring to FIG. 1, controller (18) is signaled (32) by each of the multiple channels (12, 14, 16) as to whether the output signals (26, 28, 30) comprise properly decoded data or a decode EDC error. Controller (18) uses this information to select one of the output signals (26, 28, 30) from the multiple channels (12, 14, 16) for further use. In that regard, if any one or more of the multiple channels (12, 14, 16) present an output signal (26, 28, 30) comprising properly decoded data, one such output signal (26, 28, 30) is the output selected by controller (18) to be sent on using selector (20). Alternatively, if all of the output signals (26, 28, 30) presented by the multiple channels (12, 14, 16) comprise decode EDC errors, controller (18) selects one such output signal (26, 28, 30) to be sent to inner ECC decoder (22) using selector (20) in an attempt to correct the decode EDC error presented. If the error is correctable, inner ECC decoder (22) provides a corrected data output signal (34).

As previously noted, however, with the prior art inner ECC architecture of FIG. 1, a problem arises as to which output signal (26, 28, 30) from multiple channels (12, 14, 16) is to be selected by controller (18) for correction by inner ECC decoder (22) if all output signals (26, 28, 30) from multiple channels (12, 14, 16) are in error, i.e., if all channels (12, 14, 16) present output signals (26, 28, 30) comprising decode EDC errors. Once again, the present approach to such a situation is for controller (18) to essentially guess which output signal (26, 28, 30) from multiple channels (12, 14, 16) to select to be sent to inner ECC decoder (22) for processing. For example, controller (18) may select the output signal (26, 28, 30) from the statistically most reliable channel (12, 14, 16), or simply the output signal (26, 28, 30) that represents the least significant type of decode EDC error. Regardless, whichever output signal (26, 28, 30) is selected by controller (18) is then sent to inner ECC decoder (22) using selector (20) in an attempt to correct the error. In that regard, FIG. 1 depicts a situation where inner ECC decoder (22) successfully corrects the error, thereby providing corrected data output (34).

As also previously noted, however, such an approach may not be the best answer, as it has its own attendant problem. Specifically, it is possible that even after operation of inner ECC decoder (22) on the output signal (26, 28, 30) selected by controller (18) from multiple channels (12, 14, 16), the decode EDC error is uncorrectable. In that case, one or more other output signals (26, 28, 30) from multiple channels (12, 14, 16) that were not selected by controller (18) may have been correctable by inner ECC decoder (22). While controller (18) might be configured to then select an output signal (26, 28, 30) from the remaining channels (12, 14, 16) for processing by inner ECC decoder (22), continuing until a selected output signal (26, 28, 30) is successfully corrected or all channel (12, 14, 16) have been exhausted, such sequential or serial selection would increase processing time, causing delay.

Referring next to FIG. 2, a block diagram of the multi-channel inner ECC architecture according to the present invention is shown, denoted generally by reference numeral 40. In general, the present invention provides, in a magnetic recording device, an improved system and method for error correction in multi-channel decoding of read data. More specifically, the present invention provides an inner ECC decoder for each of the N multiple channels. Rather than, as in the prior art, guessing which channel output should be sent to the inner ECC decoder, in the present invention, every channel output is passed through an inner ECC decoder prior to the selection process. By using multiple dedicated inner ECC decoders, the present invention guarantees that no correctable channel output will be overlooked, without causing delay by increasing processing time. If multiple channels decode properly (either no decode EDC errors are presented, or such errors are corrected by an inner ECC decoder), data from one such successful channel is selected and sent on. Similarly, if all of the channels present decode EDC errors and are all still in error even after inner ECC decoder operation (all channel outputs were uncorrectable), data from one channel is selected and sent on. The combination in the present invention of separate channel characteristics and separate inner ECC decoders for each channel provides the greatest chance for successful decoding in a multi-channel architecture.

In that regard, as seen in FIG. 2, according to the present invention, in a magnetic recording device, system (40) is provided for recovering data stored on the recording device. The system (40) includes N multiple decoding channels (42, 44, 46), N multiple inner ECC decoders (48, 50, 52), a controller (54), and a selector (56) (such as a switching or gating device known in the art). As shown in FIG. 2, each of the multiple channels (42, 44, 46) are provided in communication with one corresponding inner ECC decoder (48, 50, 52), which are each provided in communication with controller (54) and selector (56). Selector (56) is also provided in communication with controller (54).

As in the prior art, in the system (40) of the present invention, each of the multiple channels (42, 44, 46) receive a read data input signal (58), which may be either an analog or digital signal. Once again, as is readily apparent, each of the multiple channels (42, 44, 46) operate on the same analog or digital read data input signal (58). As in the prior art, each of the multiple channels (42, 44, 46) can be designed in any of a number of fashions known in the art to perform optimally under various signal characteristics.

Each of the multiple channels (42, 44, 46) provides an output signal (60, 62, 64). In each channel, if no error is detected during decoding, the output signal (60, 62, 64) presented by the channel comprises a properly decoded data output. Alternatively, however, if an error is detected during decoding, the output signal (60, 62, 64) presented by the channel comprises a decode Error Detection Code (EDC) error output, of the types well known to those of ordinary skill in the art.

Still referring to FIG. 2, in contrast to the inner ECC architecture of the prior art shown in FIG. 1, each output signal (60, 62, 64) from each of the multiple channels (42, 44, 46) is provided to one corresponding inner ECC decoder (48, 50, 52). In that regard, if the output signal (60, 62, 64) presented to the inner ECC decoder (48, 50, 52) by the corresponding channel (42, 44, 46) comprises properly decoded data, inner ECC decoder (48, 50, 52) performs no operation on the output signal (60, 62, 64) from the corresponding channel (42, 44, 46).

Alternatively, however, if the output signal (60, 62, 64) presented to the inner ECC decoder (48, 50, 52) by the corresponding channel (42, 44, 46) comprises a decode EDC error, the inner ECC decoder (48, 50, 52) attempts to correct the decode EDC error presented. If the inner ECC decoder (48, 50, 52) successfully corrects the error, then the inner ECC decoder (48, 50, 52) provides a corrected data signal. Alternatively, if the inner ECC decoder (48, 50, 52) is unable to correct the error (i.e., the decode EDC error is uncorrectable), then the inner ECC decoder (48, 50, 52) provides an uncorrectable output signal. Thus, each of the multiple inner ECC decoders (48, 50, 52) provides an output (66, 68, 70), which may variously comprise properly decoded data, corrected data, or an uncorrectable output signal, as described above.

Referring still to FIG. 2, controller (54) is signaled (72) by each of the multiple inner ECC decoders (48, 50, 52) as to whether the outputs (66, 68, 70) comprise properly decoded data, a corrected data signal, or an uncorrectable output signal. Controller (54) uses this information to select one of the outputs (66, 68, 70) from the multiple inner ECC decoders (48, 50, 52) for further use. In that regard, if any one or more of the multiple inner ECC decoders (48, 50, 52) present an output (66, 68, 70) comprising properly decoded data or corrected data, one such output (66, 68, 70) is the output selected by controller (54) to be sent on using selector (56). Alternatively, if all of the outputs (66, 68, 70) presented by the multiple inner ECC decoders (48, 50, 52) comprise uncorrectable output signals, controller (54) selects one such output (66, 68, 70) to be sent on using selector (56). Once again, FIG. 2 depicts selection by controller (54) of an output (66, 68, 70) comprising corrected data.

With reference now to FIGS. 1 and 2, rather than, as in the prior art, guessing which channel output (26, 28, 30) should be sent to the single inner ECC decoder (22), in the present invention, every channel output (60, 62, 64) is passed through an inner ECC decoder (48, 50, 52) prior to the selection process. By using multiple dedicated inner ECC decoders (48, 50, 52), the present invention guarantees that no correctable channel output (60, 62, 64) will be overlooked, without causing delay by increasing processing time. If multiple channels (42, 44, 46) decode properly (either no decode EDC errors are presented, or any such errors are corrected by corresponding inner ECC decoder (48, 50, 52)), data from one such successful channel is selected by controller (54) to be sent on. Similarly, if all of the channels (42, 44, 46) present outputs (60, 62, 64) comprising decode EDC errors, and all are still in error even after operation of inner ECC decoders (48, 50, 52) (all channel outputs were uncorrectable), data from one channel is selected by controller (54) to be sent on. As noted above, the combination of separate channel characteristics and separate inner ECC decoders for each channel provides the greatest chance for successful decoding in a multi-channel architecture.

Referring finally to FIG. 3, a simplified, representative flow chart of the method for multi-channel inner ECC according to the present invention is shown, denoted generally by reference numeral 80. As seen therein, the present invention provides, in a magnetic recording device, a method for correcting errors in decoding a read data input signal. The method comprises processing (82) the read data input signal in a plurality of decoding channels, and generating (84) an output signal from each channel, the output signal comprising a data signal when no error is detected, and an error detection code when an error is detected. The method further comprises receiving (86) the output signals in a plurality of error correction code (ECC) decoders, each ECC decoder associated with and receiving the output signal of one of the plurality of channels. The method still further comprises generating (88) from each ECC decoder a corrected data signal when the received output signal comprises an error detection code and the error is correctable, and an uncorrectable output signal when the received output signal comprises an error detection code and the error is uncorrectable, and selecting (90) one of the corrected data signals from the plurality of ECC decoders. As previously noted, the magnetic recording device may be a magnetic tape, disk, or other magnetic medium, and the read data input signal may be either a digital or an analog signal.

As is readily apparent from the foregoing description, the present invention provides, in a magnetic recording device, an improved system and method for error correction in multi-channel decoding of read data. The system and method provide an inner ECC decoder for each of N multiple decoding channels. As a result, rather than guessing, as in the prior art, which channel output should be sent to an inner ECC decoder, every channel output is passed through an inner ECC decoder. By using multiple dedicated inner ECC decoders, the system and method guarantee that no correctable channel output is overlooked, without causing delay by increasing processing time. The combination in the system and method of the present invention of separate channel characteristics and separate inner ECC decoders for each channel provides the greatest chance for successful decoding in a multi-channel architecture.

Thus it is apparent that there has been provided, in accordance with the present invention, an improved system and method for correcting errors in decoding a read data input signal in a magnetic recording device, where the magnetic recording device may be a magnetic tape, disk, or other medium, and the read data input signal may be digital or analog. While the present invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

What is claimed is:

1. In a magnetic recording device, a system for correcting errors in decoding a read data input signal, the system comprising:
    a plurality of decoding channels, each channel configured to perform under a unique signal characteristic, each channel processing the read data input signal and generating an output signal, the output signal comprising a data signal when no error is detected, and an error detection code when an error is detected;
    a plurality of error correction code (ECC) decoders, each ECC decoder associated with and receiving the output signal of one of the plurality of channels and generating a corrected data signal when the received output signal comprises an error detection code and the error is correctable; and
    a controller for selecting from the plurality of ECC decoders one of the corrected data signals.

2. The system of claim 1 wherein the magnetic recording device comprises a magnetic tape drive.

3. The system of claim 2 wherein the read data input signal comprises digital data.

4. The system of claim 2 wherein the read data input signal comprises analog data.

5. The system of claim 1 wherein the magnetic recording device comprises a magnetic disk drive.

6. The system of claim 1 wherein the read data input signal comprises digital data.

7. The system of claim 1 wherein the read data input signal comprises analog data.

8. In a magnetic recording device comprising a plurality of decoding channels for processing a read data input signal, each channel configured to perform under a unique signal characteristic, each channel processing the read data input signal and generating an output signal, the output signal comprising a data signal when no error is detected, and an error detection code when an error is detected, a method for correcting errors in decoding the read data input signal, the method comprising:
    providing a plurality of error correction code (ECC) decoders, each ECC decoder associated with and receiving the output signal of one of the plurality of channels and generating a corrected data signal when the received output signal comprises an error detection code and the error is correctable; and
    selecting from the plurality of ECC decoders one of the corrected data signals.

9. The method of claim 8 wherein the magnetic recording device comprises a magnetic tape drive.

10. The method of claim 9 wherein the read data input signal comprises digital data.

11. The method of claim 9 wherein the read data input signal comprises analog data.

12. The method of claim 8 wherein the magnetic recording device comprises a magnetic disk drive.

13. The method of claim 8 wherein the read data input signal comprises digital data.

14. The method of claim 8 wherein the read data input signal comprises analog data.

15. In a magnetic recording device, a method for correcting errors in decoding a read data input signal, the method comprising:
    processing the read data input signal in a plurality of decoding channels, each channel configured to perform under a unique signal characteristic;
    generating an output signal from each channel, the output signal comprising a data signal when no error is detected, and an error detection code when an error is detected;
    receiving the output signals in a plurality of error correction code (ECC) decoders, each ECC decoder associated with and receiving the output signal of one of the plurality of channels;
    generating from each ECC decoder a corrected data signal when the received output signal comprises an error detection code and the error is correctable; and
    selecting one of the corrected data signals from the plurality of ECC decoders.

16. The method of claim 15 wherein the magnetic recording device comprises a magnetic tape drive.

17. The method of claim 16 wherein the read data input signal comprises digital data.

18. The method of claim 16 wherein the read data input signal comprises analog data.

19. The method of claim 15 wherein the magnetic recording device comprises a magnetic disk drive.

20. The method of claim 15 wherein the read data input signal comprises digital data.

21. The method of claim 15 wherein the read data input signal comprises analog data.

* * * * *